(12) United States Patent
Vega Gonzalez et al.

(10) Patent No.: US 12,610,801 B2
(45) Date of Patent: Apr. 21, 2026

(54) METALLIZATION PROCESS FOR AN INTEGRATED CIRCUIT

(71) Applicant: IMEC VZW, Leuven (BE)

(72) Inventors: Victor Hugo Vega Gonzalez, Heverlee (BE); Bilal Chehab, Leuven (BE); Julien Ryckaert, Schaerbeek (BE); Zsolt Tokei, Leuven (BE); Serge Biesemans, Leuven (BE); Naoto Horiguchi, Leuven (BE)

(73) Assignee: Imec vzw, Leuven (BE)

( * ) Notice: Subject to any disclaimer, the term of this patent is extended or adjusted under 35 U.S.C. 154(b) by 457 days.

(21) Appl. No.: 18/066,400

(22) Filed: Dec. 15, 2022

(65) Prior Publication Data

US 2023/0197514 A1      Jun. 22, 2023

(30) Foreign Application Priority Data

Dec. 17, 2021     (EP) ..................................... 21215780

(51) Int. Cl.
　　　*H10W 20/00*　　　(2026.01)
　　　*H10D 84/85*　　　(2025.01)
　　　　　　(Continued)

(52) U.S. Cl.
　　CPC ........... *H10W 20/069* (2026.01); *H10P 50/71* (2026.01); *H10W 20/063* (2026.01);
　　　　　　(Continued)

(58) Field of Classification Search
　　CPC ........... H10D 30/6735; H10D 30/6757; H10D 30/014; H10D 84/85; H10D 84/851;
　　　　　　(Continued)

(56) References Cited

U.S. PATENT DOCUMENTS 6,600,173 B2 *　7/2003　Tiwari ................... H10B 10/00
　　　　　　　　　　　　　　　　　　977/936
9,461,143 B2 *　10/2016　Pethe ................ H01L 21/31111
　　　　　　　　(Continued)

FOREIGN PATENT DOCUMENTS

EP　　　　3913659 A1　　11/2021

OTHER PUBLICATIONS

Weckx et al., "Novel forksheet device architecture as ultimate logic scaling device towards 2nm", (Year: 2019).*
(Continued)

*Primary Examiner* — Sophia T Nguyen
(74) *Attorney, Agent, or Firm* — McDonnell Boehnen Hulbert & Berghoff LLP

(57)　　　　　　ABSTRACT

The disclosure relates to a metallization process for an integrated circuit. One example metallization process includes a method for forming an integrated circuit that includes providing a semiconductor structure having two transistor structures, a gate structure, electrically conductive contacts, a first electrically conductive line, a first electrically conductive via, a second electrically conductive via. The method further includes providing a planar dielectric material in contact with the first electrically conductive line, forming an opening in the planar dielectric material, filling the opening with a planar electrically conductive material, forming an electrically conductive layer arranged within a second metallization level, the electrically conductive layer being in physical contact with the planar dielectric material and in physical and electrical contact with the electrically conductive material, providing a hard mask comprising a set of parallel lines, and etching the electrically conductive layer and the planar electrically conductive material by using the hard mask lines as a mask.

15 Claims, 12 Drawing Sheets

(51) Int. Cl.
    *H10P 50/00*     (2026.01)
    *H10P 50/26*     (2026.01)
    *H10W 20/42*     (2026.01)
    *H10W 20/44*     (2026.01)

(52) U.S. Cl.
    CPC ............ *H10W 20/42* (2026.01); *H10D 84/85* (2025.01); *H10P 50/267* (2026.01); *H10W 20/4441* (2026.01)

(58) Field of Classification Search
    CPC .............. H10D 84/852; H10D 84/853; H10D 84/0158; H10D 84/0186; H10D 84/0149; H10D 84/0153; H10D 84/0151; H10D 89/10; H01L 23/5286; H01L 23/481; H01L 23/528; H01L 23/50; H01L 23/52; H01L 23/522; H01L 23/5221; H01L 23/5226; H01L 23/5283; H01L 23/535; H01L 21/76895; H10B 20/25; H10B 20/20
    See application file for complete search history.

(56) References Cited

U.S. PATENT DOCUMENTS

| | | | | |
|---|---|---|---|---|
| 9,583,493 | B2 * | 2/2017 | Kim | H01L 23/528 |
| 9,589,955 | B2 * | 3/2017 | Baek | H10D 86/011 |
| 10,163,689 | B2 * | 12/2018 | Ting | H10W 20/089 |
| 10,243,053 | B1 * | 3/2019 | Xie | H10D 64/258 |
| 10,580,733 | B2 * | 3/2020 | Kim | H01L 23/528 |
| 10,777,504 | B2 * | 9/2020 | Yu | H01L 21/288 |
| 10,923,475 | B2 * | 2/2021 | Shin | H01L 21/76897 |
| 11,289,469 | B2 * | 3/2022 | Lee | H10D 89/10 |
| 11,757,040 | B2 * | 9/2023 | Bae | H01L 23/485 257/368 |
| 2009/0108360 | A1 * | 4/2009 | Smayling | H10D 84/038 438/599 |
| 2010/0295136 | A1 * | 11/2010 | Or-Bach | H03K 19/17704 257/390 |
| 2012/0313148 | A1 * | 12/2012 | Schultz | H01L 21/76832 438/666 |
| 2015/0084097 | A1 * | 3/2015 | Jeon | H10D 84/907 438/129 |
| 2015/0348962 | A1 * | 12/2015 | Chao | H01L 23/50 257/207 |
| 2016/0049481 | A1 * | 2/2016 | Wei | H01L 21/76895 257/401 |
| 2016/0336183 | A1 * | 11/2016 | Yuan | H10D 30/6219 |
| 2017/0047328 | A1 * | 2/2017 | Masuoka | H10D 30/711 |
| 2017/0294448 | A1 * | 10/2017 | Debacker | H01L 23/5286 |
| 2017/0338115 | A1 * | 11/2017 | Yen | H10P 76/4085 |
| 2017/0345809 | A1 * | 11/2017 | Chang | G06F 30/327 |
| 2018/0145030 | A1 * | 5/2018 | Beyne | H01L 21/76898 |
| 2018/0342505 | A1 * | 11/2018 | Baek | H10D 84/038 |
| 2019/0020343 | A1 * | 1/2019 | Lee | H10D 86/00 |
| 2019/0080969 | A1 * | 3/2019 | Tsao | H01L 21/76224 |
| 2019/0139823 | A1 * | 5/2019 | Chen | H10W 20/056 |
| 2019/0206893 | A1 * | 7/2019 | Liaw | H01L 21/76895 |
| 2019/0229196 | A1 * | 7/2019 | Sherazi | H10D 64/017 |
| 2019/0251223 | A1 * | 8/2019 | Chang | H01L 23/528 |

| | | | | |
|---|---|---|---|---|
| 2019/0319022 | A1 * | 10/2019 | Song | H10D 84/85 |
| 2020/0058328 | A1 * | 2/2020 | Chang | H10B 20/25 |
| 2020/0105752 | A1 * | 4/2020 | Liaw | H10D 30/6757 |
| 2020/0105761 | A1 * | 4/2020 | Liaw | H10D 84/853 |
| 2020/0152507 | A1 * | 5/2020 | Ting | H10W 20/089 |
| 2021/0082766 | A1 * | 3/2021 | Miura | H10D 84/038 |
| 2021/0143085 | A1 | 5/2021 | Cheng et al. | |
| 2021/0202503 | A1 * | 7/2021 | Chang | G11C 17/16 |
| 2021/0296231 | A1 | 9/2021 | Karpov et al. | |
| 2021/0336001 | A1 * | 10/2021 | Yang | H10D 84/038 |
| 2021/0358911 | A1 * | 11/2021 | Zhang | H10D 84/0193 |
| 2021/0407999 | A1 * | 12/2021 | Huang | H10D 62/121 |
| 2021/0408009 | A1 * | 12/2021 | Zheng | H10D 84/0167 |
| 2022/0093594 | A1 * | 3/2022 | Song | H10D 84/85 |
| 2022/0093647 | A1 * | 3/2022 | Sung | H10D 84/0177 |
| 2022/0093734 | A1 * | 3/2022 | Chan | H10D 30/6748 |
| 2022/0102520 | A1 * | 3/2022 | Shiliang | H10D 30/6757 |
| 2022/0216319 | A1 * | 7/2022 | Iwahori | H10D 30/6735 |
| 2022/0262730 | A1 * | 8/2022 | Liaw | H10D 84/853 |
| 2022/0349932 | A1 * | 11/2022 | Wang | G01R 19/10 |
| 2022/0352186 | A1 * | 11/2022 | Chang | G11C 17/16 |
| 2022/0359545 | A1 * | 11/2022 | Chang | H10D 64/017 |
| 2022/0382949 | A1 * | 12/2022 | Lee | H10D 89/10 |
| 2022/0415885 | A1 * | 12/2022 | Sobue | H10D 62/121 |
| 2023/0053433 | A1 * | 2/2023 | Serizawa | H10D 64/017 |
| 2023/0062162 | A1 * | 3/2023 | Chen | H01L 23/5226 |
| 2023/0124681 | A1 * | 4/2023 | Xie | H10D 30/014 257/369 |
| 2023/0197514 | A1 * | 6/2023 | Vega Gonzalez | H01L 21/76897 438/621 |
| 2023/0197528 | A1 * | 6/2023 | Chan | H10D 84/038 257/369 |
| 2023/0197826 | A1 * | 6/2023 | Radlinger | H10D 84/0151 257/401 |
| 2023/0290840 | A1 * | 9/2023 | Akkaya | H10D 84/83 |
| 2023/0343788 | A1 * | 10/2023 | Yang | H10D 84/0193 |
| 2023/0420534 | A1 * | 12/2023 | Chung | H10D 84/0137 |
| 2024/0047522 | A1 * | 2/2024 | Liaw | H10D 84/0149 |
| 2024/0072047 | A1 * | 2/2024 | Xie | H01L 21/76897 |
| 2024/0105728 | A1 * | 3/2024 | Liang | H10D 30/6757 |
| 2024/0105797 | A1 * | 3/2024 | Liang | H10D 30/0198 |
| 2024/0203994 | A1 * | 6/2024 | Gupta | H01L 23/535 |
| 2024/0213155 | A1 * | 6/2024 | Bae | H01L 23/5226 |
| 2024/0213250 | A1 * | 6/2024 | Koh | H10D 84/853 |
| 2024/0224512 | A1 * | 7/2024 | Chang | H10B 20/25 |
| 2024/0282671 | A1 * | 8/2024 | Chen | H10D 84/85 |
| 2024/0332294 | A1 * | 10/2024 | Xie | H10D 30/014 |
| 2024/0347618 | A1 * | 10/2024 | Radlinger | H10D 64/514 |
| 2024/0389310 | A1 * | 11/2024 | Chang | H10D 64/018 |
| 2024/0429276 | A1 * | 12/2024 | Yemenicioglu | H10D 62/151 |
| 2025/0070018 | A1 * | 2/2025 | Yang | H10B 20/25 |
| 2025/0133811 | A1 * | 4/2025 | Radlinger | H10D 84/834 |
| 2025/0194238 | A1 * | 6/2025 | Reboh | H10D 84/85 |
| 2025/0203936 | A1 * | 6/2025 | Xie | H10D 84/0151 |
| 2025/0311417 | A1 * | 10/2025 | Shadman | H10D 84/0177 |

OTHER PUBLICATIONS

Extended European Search Report and Written Opinion, Application No. EP 21215780.4, mailed Jun. 1, 2022, 7 pages.

* cited by examiner

METALLIZATION PROCESS FOR AN INTEGRATED CIRCUIT

CROSS-REFERENCE TO RELATED APPLICATIONS

The present application is a non-provisional patent application claiming priority to European Patent Application No. EP 21215780.4, filed Dec. 17, 2021, the contents of which are hereby incorporated by reference.

FIELD OF THE DISCLOSURE

The present invention relates to the field of integrated circuits, and more in particular to a metallization process for forming an integrated circuit.

BACKGROUND

There is a constant drive to scale down integrated circuits. This drive translates into a need for reducing the size of the standard cell used in integrated circuits. In this respect, the type of transistor used and the way metal track lines are packed are key factors. In particular, the poly pitch (i.e., the pitch of successive transistor gates), the metal pitch (i.e., the pitch of successive metal track lines), and the cell height can, in principle, be minimized. However, further minimization and scaling of the poly pitch becomes increasingly challenging.

The difficulties in further minimizing and scaling of the poly pitch have motivated recent attempts to reduce the cell height. As illustrated in FIG. 1, these attempts have reduced the height of the standard cell which has become more rectangular as a result. As can be readily observed, reducing the cell height also reduces the number of metal track lines per standard cell. This reduction has an impact on how one can connect one circuit to another circuit on the wafer. Indeed, reducing the number of metal track lines per standard cell also reduces the routability of the lower metal layers of the standard cell due to high pin density, low pin accessibility, and limited routing resources.

For these reasons, the cell height remains stuck at the "five-track" level, i.e., a cell height that can vertically accommodate five tracks to access the pins.

There is therefore a need in the art for new methods and systems to scale down integrated circuits.

SUMMARY

The present invention provides systems or methods for forming an integrated circuit.

One embodiment relates to a method for forming an integrated circuit or an intermediate in the formation thereof. The method includes comprising the steps of:

a. providing a semiconductor structure includes i. two transistor structures separated by a dielectric separation, each transistor structure comprising a pMOS side of a first doping type and an nMOS side of a second doping type, each side forming a channel structure, a source portion, and a drain portion, the source portion and the drain portion being horizontally separated by the channel structure, ii. a gate structure on the channel structure, iii. electrically conductive contacts electrically coupled to the source portion and the drain portion of each side of each transistor structure, iv. a first electrically conductive line arranged within a first metallization level and extending along a first direction, the first electrically conductive line extending above at least part of each transistor structure, v. a first electrically conductive via electrically connecting the first electrically conductive line with a first electrically conductive contact on a first side of a first of the transistor structures, and vi. a second electrically conductive via electrically connecting the first electrically conductive line with a second electrically conductive contact on a first side of a second of the transistor structures.

b. providing a planar dielectric material in physical contact with a top surface of the first electrically conductive line, c. forming an opening in the planar dielectric material, the opening exposing part of the first electrically conductive line, the part having a length larger than a length of the dielectric separation when both lengths are measured in the first direction, wherein the length of the part comprises the length of the dielectric separation when the latter is vertically projected on the length of the part, d. filling the opening with a planar electrically conductive material, e. forming an electrically conductive layer arranged within a second metallization level, the electrically conductive layer being in physical contact with the planar dielectric material and in physical and electrical contact with the electrically conductive material, f. providing a hard mask comprising a set of parallel lines in physical contact with a top surface of the electrically conductive layer and extending along a second direction, perpendicular to the first direction, the lines having a width measured in the first direction, two of the lines being directly above the planar electrically conductive material filling the opening so that the length of the part comprises the width of the two lines when they are vertically projected on the length of the part, g. etching the electrically conductive layer and the planar electrically conductive material by using the hard mask lines as a mask, thereby forming:

i. a set of second electrically conductive lines arranged within the second metallization level, and extending along the second direction, the set of second electrically conductive lines comprising a pair of neighboring lines directly above the opening, the pair being separated by a first gap, ii. a third electrically conductive via extending in the opening, aligned with a first electrically conductive line of the pair, and electrically connecting the first electrically conductive line of the pair with the first electrically conductive line, and iii. a fourth electrically conductive via extending in the opening, aligned with a second electrically conductive line of the pair, and electrically connecting the second electrically conductive line of the pair with the first electrically conductive line.

Another embodiment provides for the production of a scaled-down integrated circuit. In particular, the disclosed embodiment makes it possible to construct a standard cell having a "four tracks" height where current technology only allows the production of a "five tracks" high standard cell. It is an advantage of embodiments of the present invention that they enable the production of a standard cell having a height corresponding to "four tracks" wherein the metal track lines are no longer present along the standard cell vertical axis, but well along its horizontal axis. This allows standard cells obtainable by embodiments of the present invention to be "four tracks" high while actually comprising more than four tracks. FIG. 1 illustrates two examples of standard cells of the prior art having each metal track extending horizontally along the vertical axis of the cell. In a standard cell, the horizontal and vertical axes are defined with respect to the cell observed from above the substrate and oriented so that the transistor channel is oriented horizontally. Such cells can be referred to as HVH cells because the first level of conductive lines has its lines extending horizontally (H), and since each successive level alternates in orientation. In embodiments of the present invention, the first level of conductive lines has its lines extending vertically (V). Such cells can, therefore, be referred to as VHV cells. In other words, in embodiments, we start the intra-routing connection within the standard cell in a Vertical layer so we finalize the cell with a Horizontal layer, and then the place and route tool will access the cell with a Vertical layer again (VHV).

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

The above, as well as additional features will be better understood through the following illustrative and non-limiting detailed description, with reference to the appended drawings.

Figure 1:
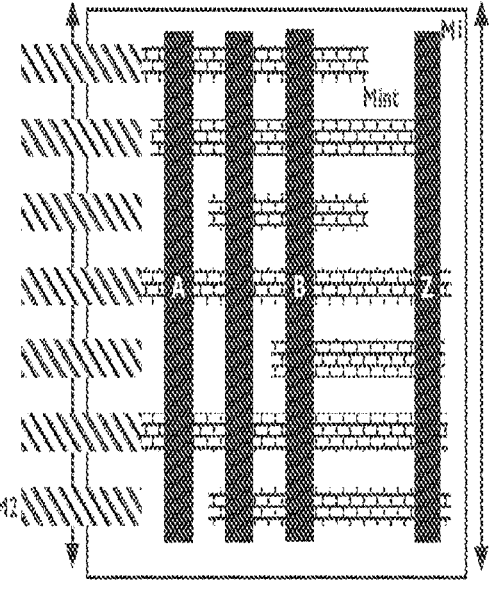
FIG. 1 is a top view of two schematized standard cells.
Figure 1:
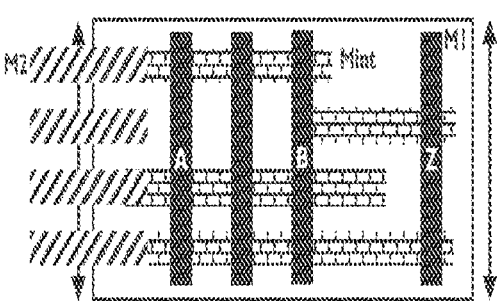

In the different figures, the same reference signs refer to the same or analogous elements.

DETAILED DESCRIPTION

The present disclosure will be described with respect to particular embodiments and with reference to certain drawings but is not limited only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The term "comprising" as used in the claims should not be interpreted as being restricted to the elements listed thereafter; it does not exclude other elements or steps. Thus, the term "comprising" specifies the presence of the stated features, integers, steps or components as referred to, but does not preclude the presence or addition of one or more other features, integers, steps or components, or groups thereof. The term "comprising" therefore covers the situation where only the stated features are present (and can therefore always be replaced by "consisting of" in order to restrict the scope to the stated features) and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Similarly, the term "coupled" as used in the claims should not intended to mean a direct connections. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, the description of exemplary embodiments, various features are sometimes grouped together in a single embodiment, figure, or description thereof for the purpose of streamlining the disclosure and aiding in the understanding of one or more of the various embodiments. This method of disclosure, however, is not intended to reflect any intention that the claims require more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of this disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Based upon this detailed description of several embodiments, other embodiments can be configured according to the knowledge of persons skilled in the art without departing from the technical teaching of the disclosure, the disclosure is limited only by the terms of the appended claims.

Figure 2:
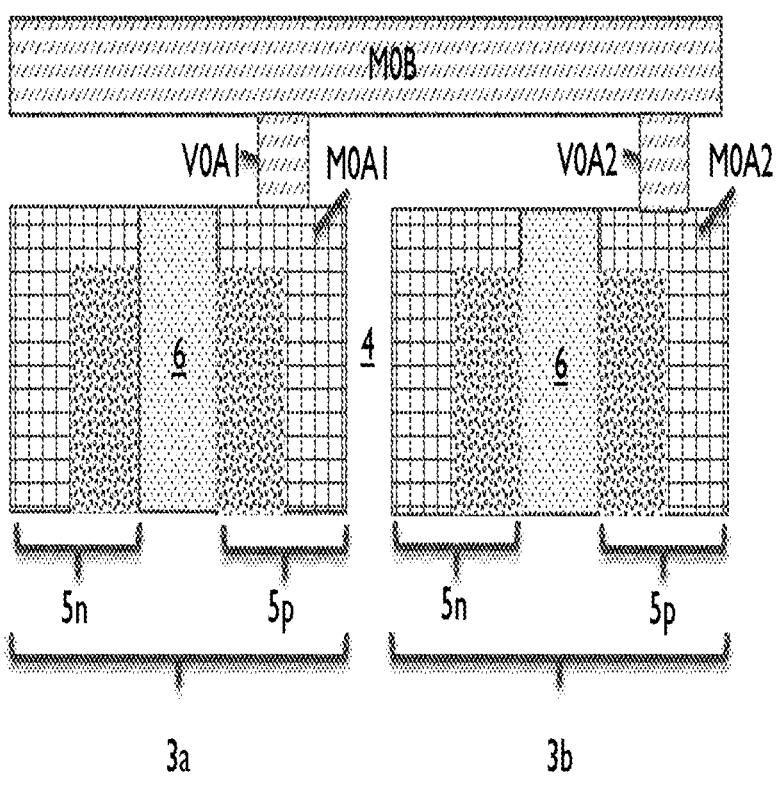
FIG. 2 is a schematic representation of a vertical cross-section through an intermediate in the fabrication of an integrated circuit according to an embodiment.
Figure 3:
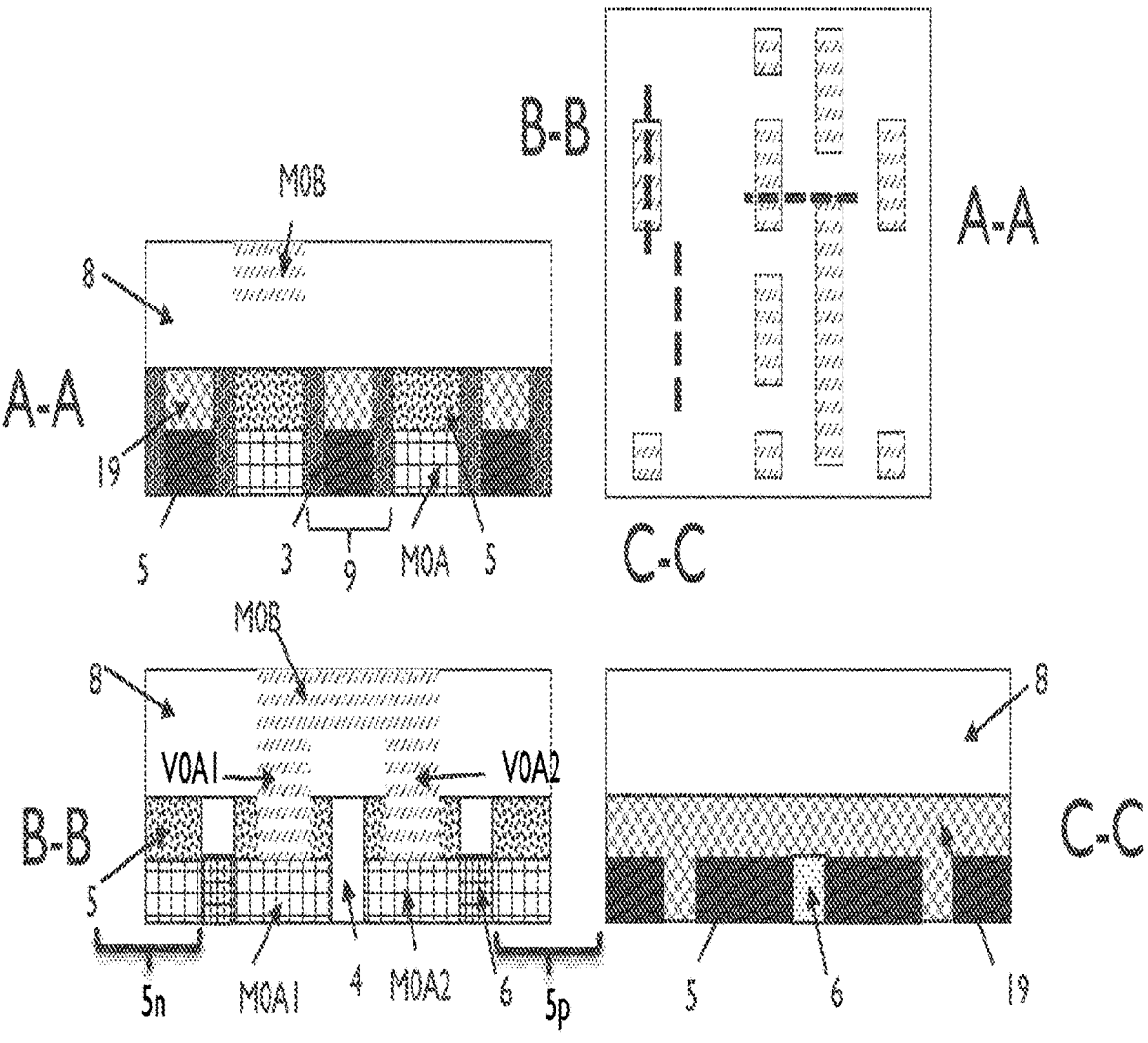
FIG. 3 is a schematic representation of several vertical cross-sections through an intermediate in the fabrication of an alternative to the integrated circuit fabricated and illustrated in FIG. 2, and FIGS. 4 to 11.
Figure 4:
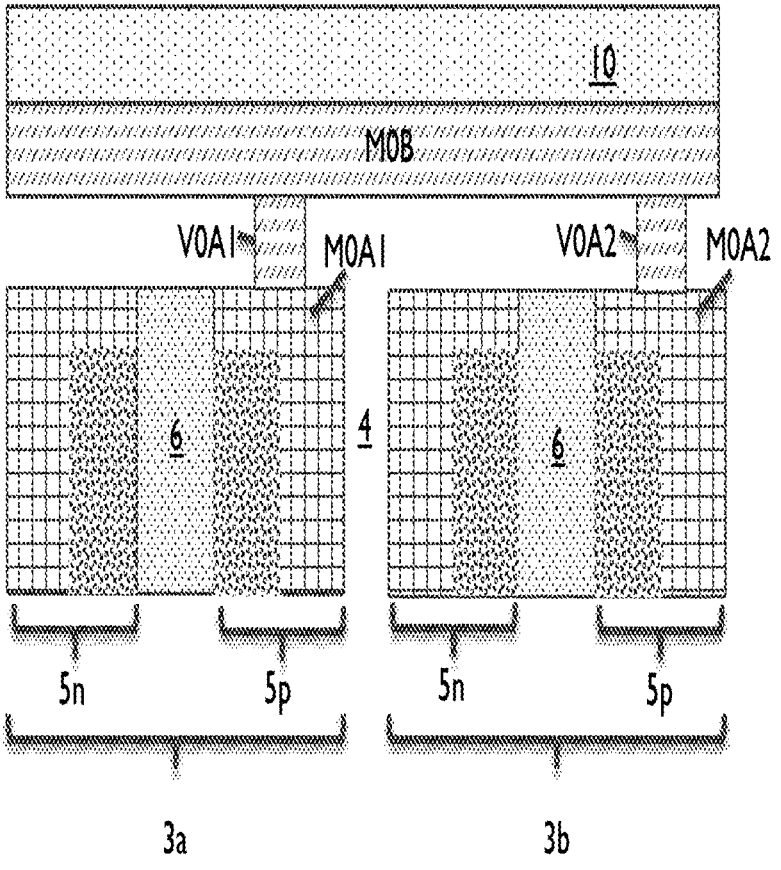
FIGS. 4 to 11 are schematic representations of vertical cross-sections through intermediates in the fabrication of an integrated circuit according to one or more of the embodiments.
Figure 5:
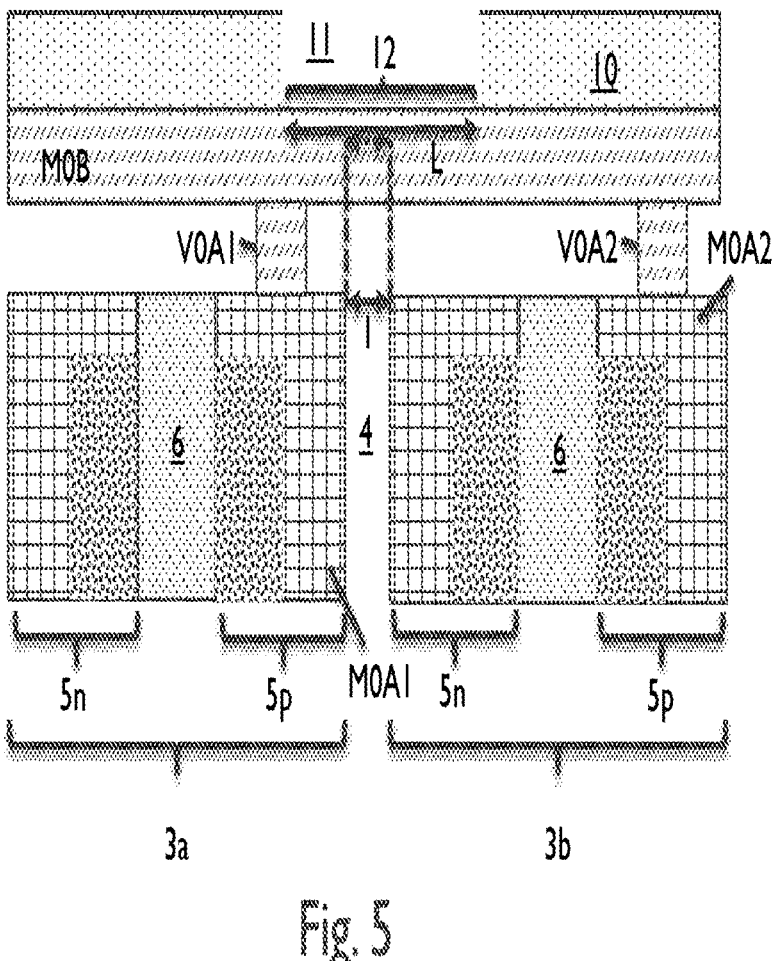
Figure 6:
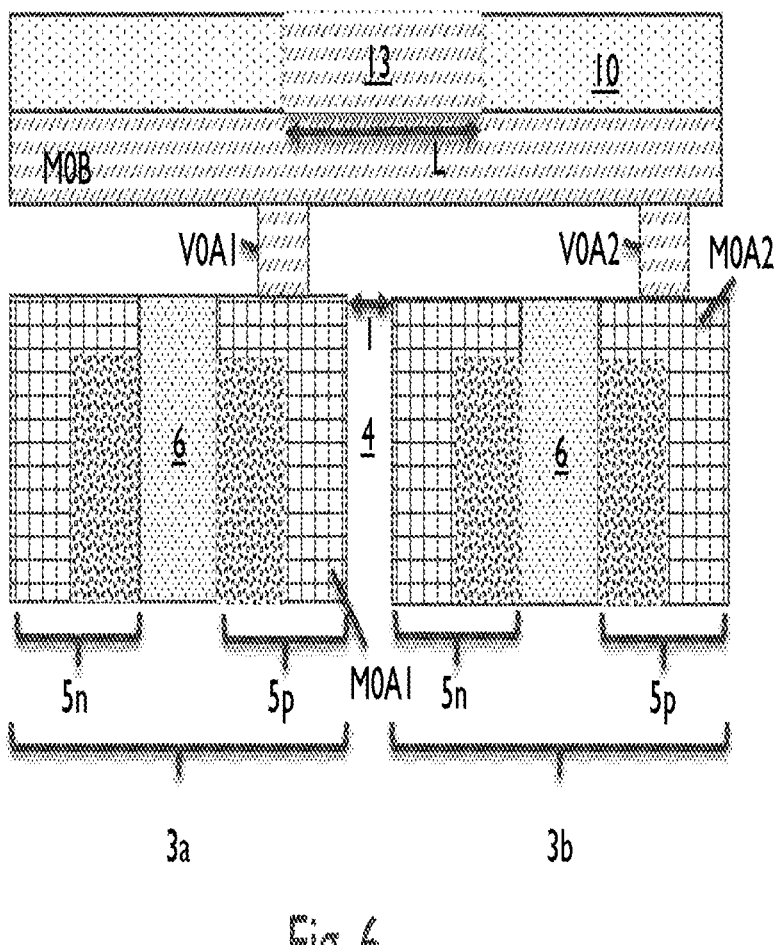
Figure 7:
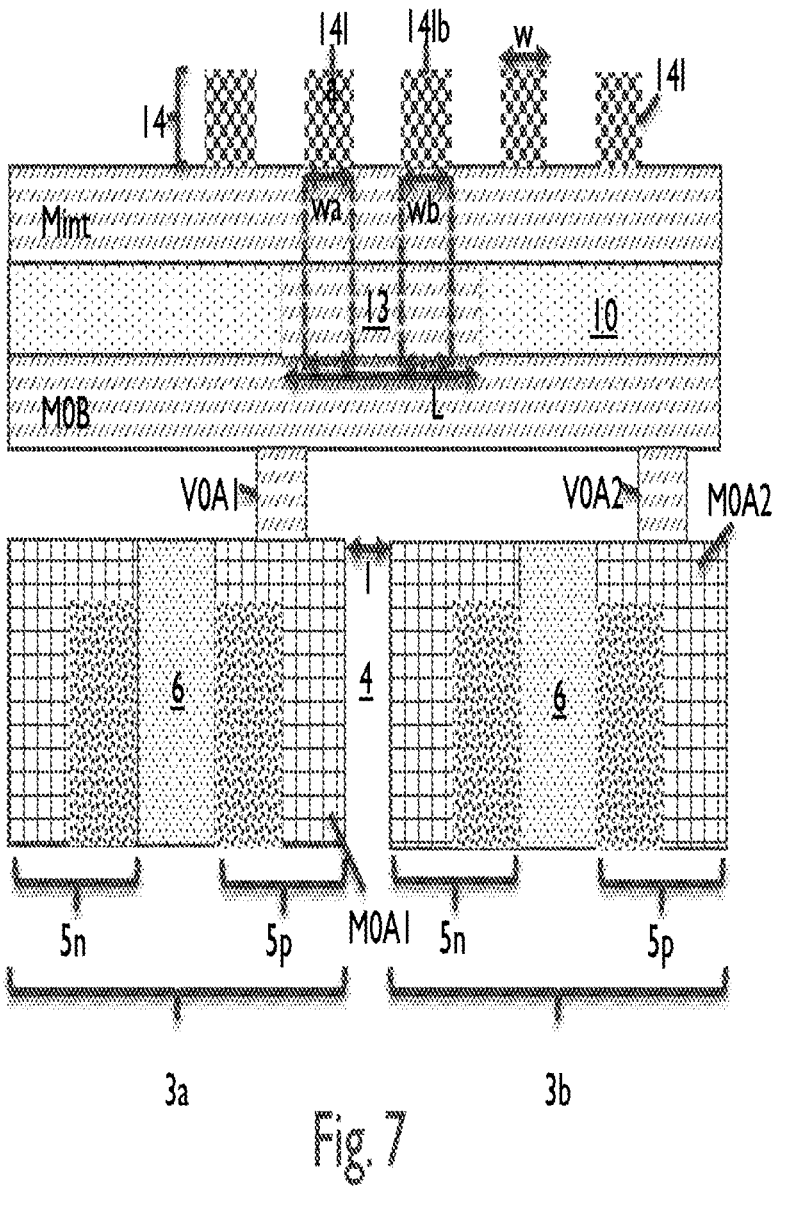
Figure 8:
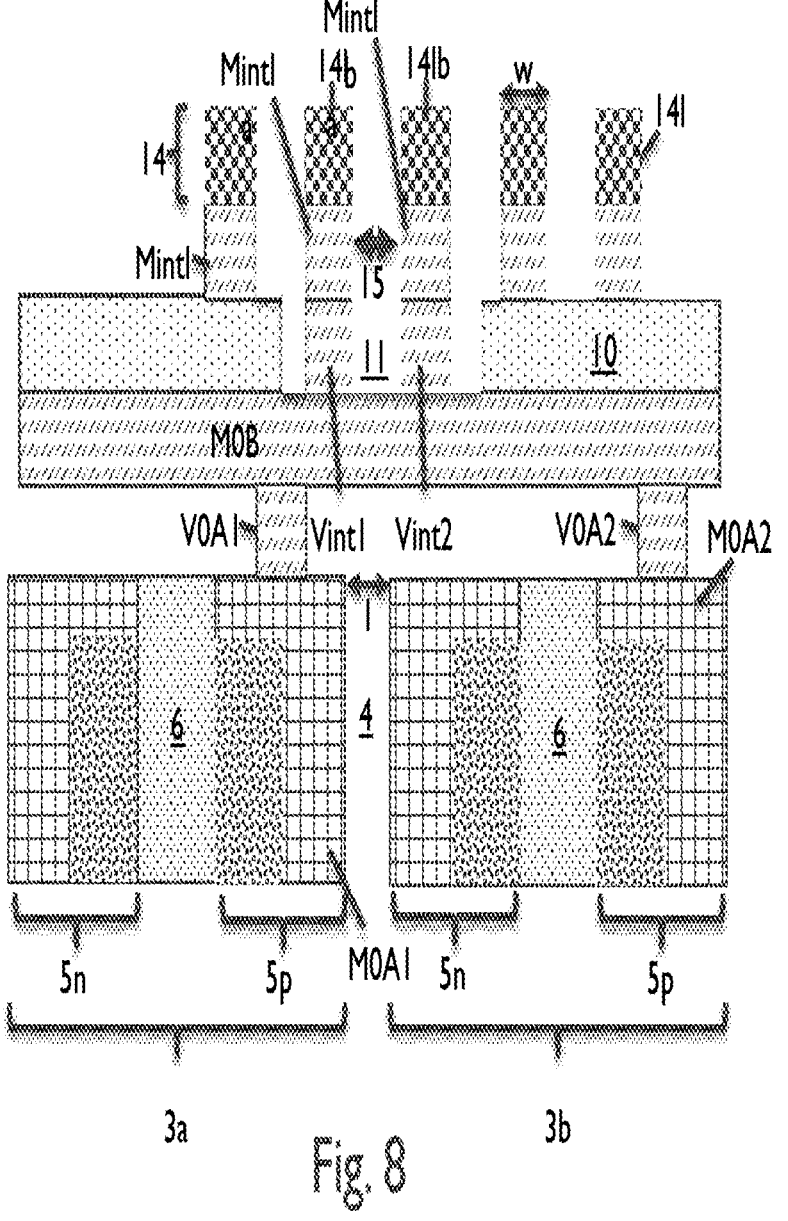
Figure 9:
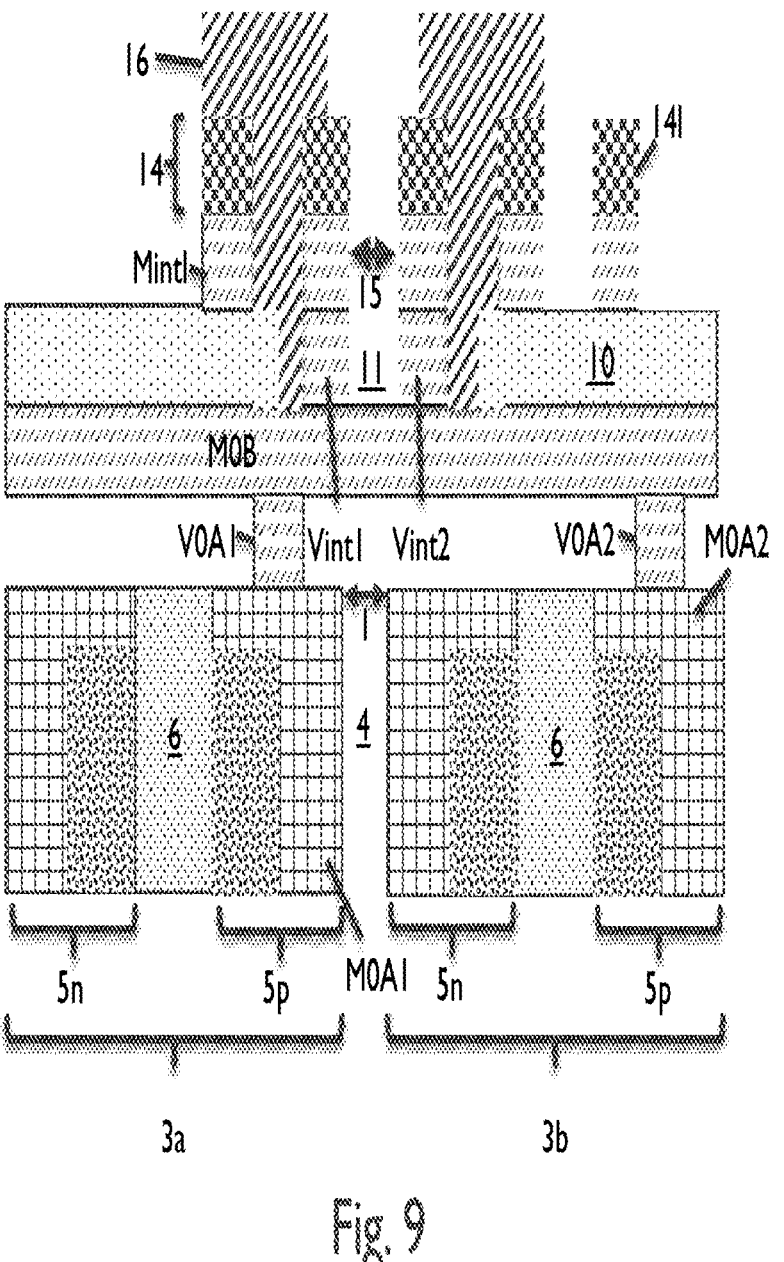

FIGS. 2 to 10 illustrate a method for forming an integrated circuit or an intermediate in the formation thereof comprising the steps of:

a. as illustrated in FIG. 2 and FIG. 3, providing a semiconductor structure (2) comprising:

i. two transistor structures (3*a*, 3*b*) separated by a dielectric separation (4), each transistor structure (3*a*, 3*b*) comprising a pMOS side (5*p*) of a first doping type and an nMOS side (5*n*) of a second doping type, each side forming a channel structure, a source portion, and a drain portion, the source portion and the drain portion being horizontally separated by the channel structure, ii. a gate structure (9) on the channel structure, iii. electrically conductive contacts (M0A1, M0A2) electrically coupled to the source portion and the drain portion of each side (5*p*, 5*n*) of each transistor structure (3*a*, 3*b*), iv. a first electrically conductive line (MOB) arranged within a first metallization level and extending along a first direction, the first electrically conductive line (MOB) extending above at least part of each transistor structure (3*a*, 3*b*), v. a first electrically conductive via (V0A1) electrically connecting the first electrically conductive line (MOB) with a first electrically conductive contact (M0A1) on a first side (5*n*, 5*p*) of a first (3*a*) of the transistor structures (3*a*, 3*b*), vi. a second electrically conductive via (V0A2) electrically connecting the first electrically conductive line (MOB) with a second electrically conductive contact (M0A2) on a first side (5*n*, 5*p*) of a second (3*b*) of the transistor structures (3*a*, 3*b*), b. providing a planar dielectric material (10) in physical contact with a top surface of the first electrically conductive line (MOB), as illustrated in FIG. 4, c. forming an opening (11) in the planar dielectric material (10), the opening (11) exposing part (12) of the first electrically conductive line (MOB), the part (12) having a length (L) larger than a length (1) of the dielectric separation (4) when both lengths are measured in the first direction, wherein the length (L) of the part (12) comprises the length (1) of the dielectric separation (4) when the later (l) is vertically projected on the length (L) of the part (12) as illustrated in FIG. 5, d. filling the opening (11) with a planar electrically conductive material (13) as illustrated in FIG. 6, e. forming an electrically conductive layer (Mint) arranged within a second metallization level, the electrically conductive layer (Mint) being in physical contact with the planar dielectric material (10) and in physical and electrical contact with the electrically conductive material (13) as illustrated in FIG. 7, f. providing a hard mask (14) comprising a set of parallel lines (141) in physical contact with a top surface of the electrically conductive layer (Mint) and extending along a second direction, perpendicular to the first direction, the lines (141) having a width (w) measured in the first direction, two (141*a*, 141*b*) of the lines (141) being directly above the planar electrically conductive material (13) filling the opening (11) so that the length (L) of the part (12) comprises the width (wa, wb) of the two lines (141*a*, 141*b*) when they are vertically projected on the length (L) of the part (12) as illustrated in FIG. 7, g. etching the electrically conductive layer (Mint) and the planar electrically conductive material (13) by using the hard mask lines (141) as a mask (as illustrated in FIG. 9), thereby forming:

i. a set of second electrically conductive lines (Mint1) arranged within the second metallization level, and extending along the second direction, the set of second electrically conductive lines (Mint1) comprising a pair of neighbouring lines (Mint1*a*, Mint1*b*) directly above the opening (11), the pair (Mint1*a*, Mint1*b*) being separated by a first gap (15), ii. a third electrically conductive via (Vint1) extending in the opening (11), aligned with a first electrically conductive line (Mint1*a*) of the pair (Mint1*a*, Mint1*b*), and electrically connecting the first electrically conductive line (Mint1*a*) of the pair (Mint1*a*, Mint1*b*) with the first electrically conductive line (MOB), and iii. a fourth electrically conductive via (Vint2) extending in the opening (11), aligned with a second electrically conductive line (Mint1*b*) of the pair (Mint1*a*, Mint1*b*), and electrically connecting the second electrically conductive line (Mint1*b*) of the pair (Mint1*a*, Mint1*b*) with the first electrically conductive line (MOB), thereby enabling excellent scaling.

Step g assures that the third and fourth electrically conductive vias (Vint1, and Vint2) are self-aligned with the first and second electrically conductive lines (Mint1*a*, Mint1*b*). Even if there would be variability in the width or position of the first and second electrically conductive lines (Mint1*a*, Mint1*b*), step g ensures that the third and fourth electrically conductive vias (Vint1, Vint2) are precisely aligned with the first and second electrically conductive lines (Mint1*a*, Mint1*b*) respectively. This is a self-correcting mechanism. These vias going down from the set of second electrically conductive lines (Mint1) have for purpose carrying signals that have to reach the source and the drain. Connecting the electrically conductive lines (Mint1) with the source or drain contact (M0A) requires an electrical connection. The method according to the first aspect provides this connection.

Figure 10:
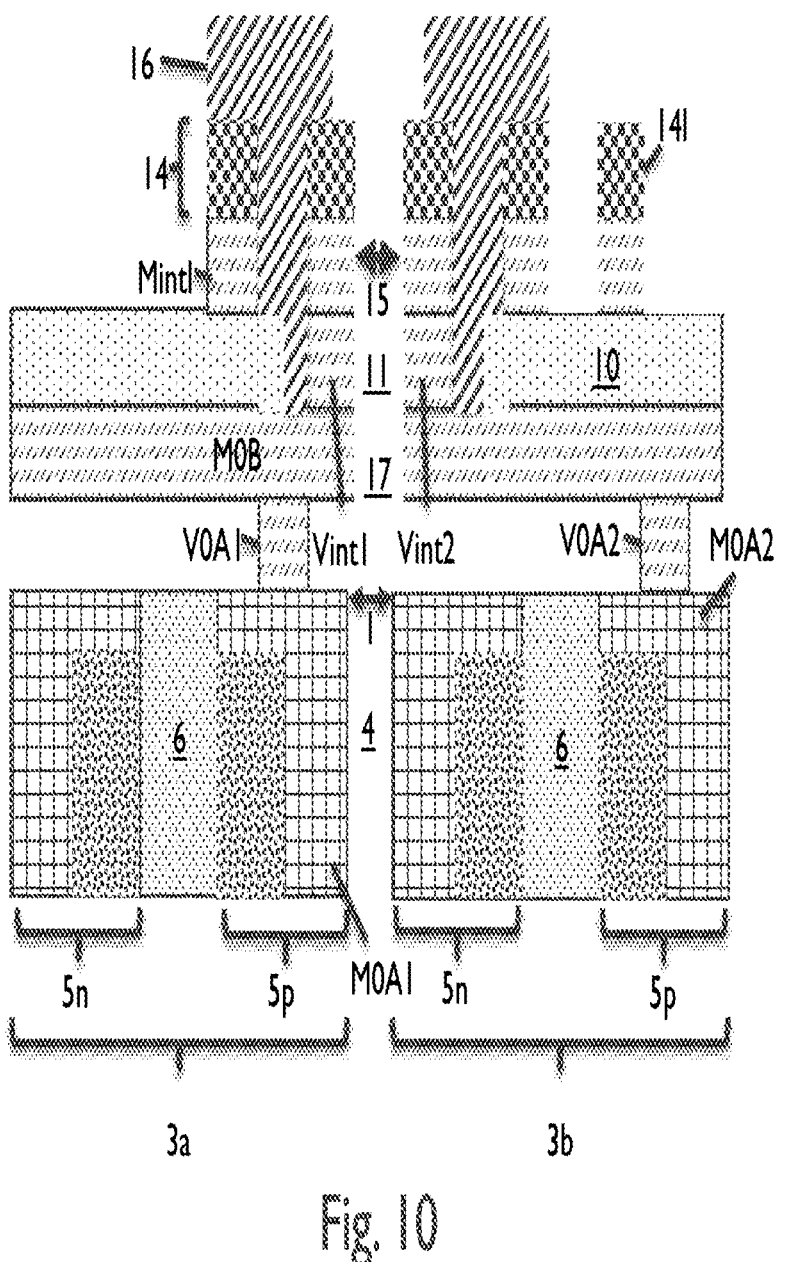

In another embodiment, the method may further comprise the steps of:

h. covering with a masking material (16) a portion of the first electrically conductive line (MOB) which is not exposed by the first gap (15) while leaving the first gap (15) uncovered as illustrated in FIG. 9, i. interrupting the first electrically conductive line (MOB) by etching it using as a mask the hardmask lines (141) and/or the electrically conductive lines (Mint1) if the electrically conductive lines (Mint1) are made of another material as the first electrically conductive line (MOB), thereby forming an interruption (17) within the first electrically conductive line (MOB), the interruption (17) being aligned with the first gap (15) as illustrated in FIG. 10.

These additional steps assure placement of the interruption (17), thereby assuring that the third electrically conductive via (Vint1) and the fourth electrically conductive via (Vint2) make contact with the first electrically conductive line (MOB). With these additional steps, the hard mask lines (141) are typically used twice as a mask, first for forming the electrically conductive vias (Vint1, and Vint2) aligned with the electrically conductive lines (Mint1), and second for forming the interruption (17) aligned with the first gap (15) between the third and the fourth electrically conductive via (Vint1, Vint2). Hence, even if there would be variability in the width or position of the first and second electrically conductive lines (Mint1a, Mint1b), step g ensures that the third and fourth electrically conductive vias (Vint1, Vint2) are aligned with the first and second electrically conductive lines (Mint1a, Mint1b) respectively and that the interruption is aligned with the first gap. This is a self-correcting mechanism.

In some embodiments, the electrically conductive material making the second electrically conductive lines (Mint1) may be different from the electrically conductive material making the first electrically conductive line (MOB) and can be etched selectively with respect to the first electrically conductive line (MOB) during step i. That way, even if the hard mask lines (141) are entirely consumed before or during step i, step i can still occur. However, the penalty of losing the hard mask lines (141) is that the possibility to process the vias (V1) self-aligned to the second electrically conductive lines (Mint1) in step j (see below) is lost. Accordingly, in some embodiments, hard mask lines (141) are not entirely consumed before the end of step i.

Figure 11:
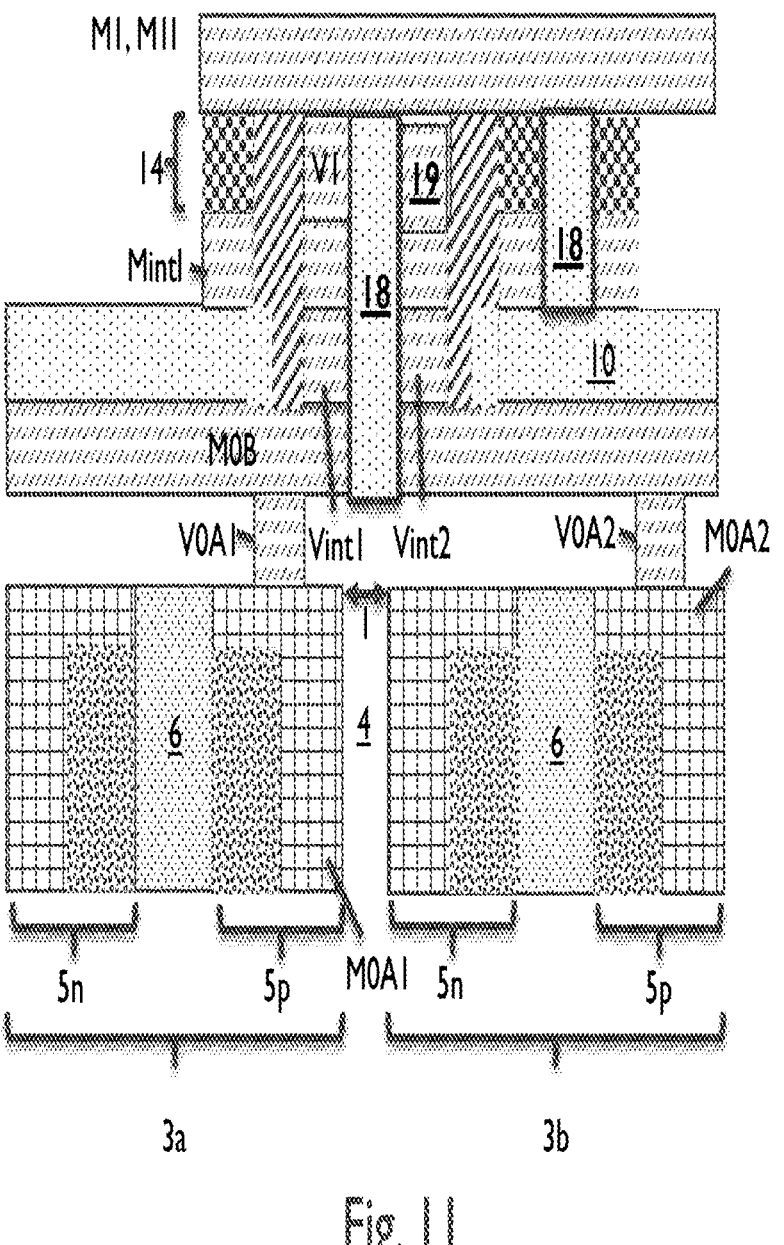

In another embodiment, the method may further comprise after step i, the step j of forming:

a. above the second metallization level, a set of third electrically conductive lines (Mil) arranged within a third metallization level, and extending along the first direction, as illustrated in FIG. 11, and b. a via (V1) electrically connecting a third electrically conductive line (Mil) with a second electrically conductive line (Mint1).

In another embodiment, step j may comprise:

i. filling the interruption (17), the opening (11), and the first gap (15) with a dielectric material (18) having a top surface coplanar with the top surface of the hard mask (14), the dielectric material (18) being such that the hard mask (14) can be etched selectively with respect to the dielectric material (18), ii. selectively removing the hard mask (14), thereby leaving second gaps, iii. filling the second gaps with an electrically conductive material, thereby forming the via (V1), and iv. forming the set of third electrically conductive lines (Mll) so that a third electrically conductive line (Mll) is electrically connected to the second electrically conductive line (Mint1) by the via (V1).

In some embodiments, in step ii, the hard mask (14) is removed selectively with respect to the dielectric material (18), and most typically with respect to the dielectric material (18) and any material exposed during step ii which is not the hard mask (14).

FIG. 2 illustrates that the first electrically conductive via (V0A1) is electrically connecting the first electrically conductive line (MOB) with a first electrically conductive contact (M0A1) on a first side, here the p-type side (5p), of a first (3a) of the transistor structures (3a, 3b), while the second electrically conductive via (V0A2) is electrically connecting the first electrically conductive line (MOB) with a second electrically conductive contact (M0A2) on a first side, here also a p-type side (5p), of a second (3b) of the transistor structures (3b).

An alternative starting point for the example method is where the first electrically conductive via (V0A1) is electrically connecting the first electrically conductive line (MOB) with a first electrically conductive contact (M0A1) on a first side, here the n-type side (5n), of a first (3a) of the transistor structures (3a, 3b), while the second electrically conductive via (V0A2) is electrically connecting the first electrically conductive line (MOB) with a second electrically conductive contact (M0A2) on a first side, here also an n-type side (5p), of a second (3b) of the transistor structures (3a, 3b).

FIG. 3 illustrates another alternative starting point for the example method where the first electrically conductive via (V0A1) is electrically connecting the first electrically conductive line (MOB) with a first electrically conductive contact (M0A1) on a first side, here the p-type side (5p), of a first (3a) of the transistor structures (3a, 3b), while the second electrically conductive via (V0A2) is electrically connecting the first electrically conductive line (MOB) with a second electrically conductive contact (M0A2) on a first side, here an n-type side (5n), of a second (3b) of the transistor structures (3a, 3b).

Another alternative starting point for the method is where the first electrically conductive via (V0A1) is electrically connecting the first electrically conductive line (MOB) with a first electrically conductive contact (M0A1) on a first side, here the n-type side (5n), of a first (3a) of the transistor structures (3a, 3b), while the second electrically conductive via (V0A2) is electrically connecting the first electrically conductive line (MOB) with a second electrically conductive contact (M0A2) on a first side, here a p-type side (5p), of a second (3b) of the transistor structures (3a, 3b).

Each of the example alternative starting points are valid starting points for performed thereon steps b and following.

In some embodiments, the example method may be for forming a standard cell of the integrated circuit or of the intermediate in the formation thereof.

In an embodiment, the standard cell may comprise four second electrically conductive lines (Mint1) and more than four third electrically conductive lines (M1l).

In an embodiment, the two transistor structures (3a, 3b) may be two nanosheet transistor structures (3a, 3b), each nanosheet transistor structure comprising two nanosheet stacks, one stack forming the pMOS side (5p) of a first doping type, and another stack forming the nMOS side (5n) of a second doping type, each side (5p, 5n) comprising a plurality of vertically stacked nanosheets (7), the plurality forming a channel structure, a source portion, and a drain portion, the source portion and the drain portion being horizontally separated by the channel structure.

Figure 12:
FIG. 12 is a schematic representation of a vertical cross-section illustrating two forksheet transistor structures.
Figure 12:
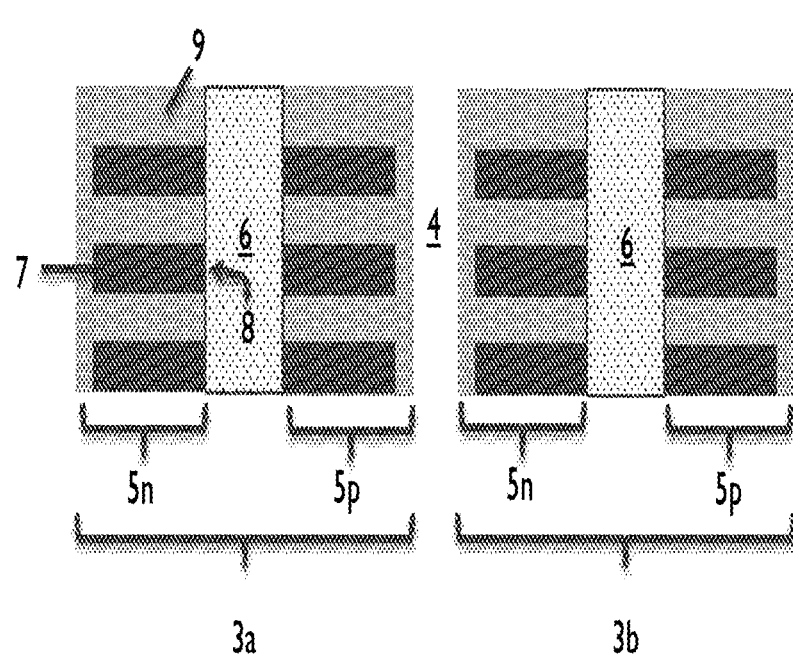

In another embodiment, the two transistor structures (3a, 3b) may be two transistor structures (3a, 3b), wherein the pMOS side (5p) of a first doping type and the nMOS side (5n) of a second doping type are separated by a dielectric wall (6), each side (5p, 5n) comprising a plurality of vertically stacked nanosheets (7), the plurality forming a channel structure, a source portion, and a drain portion, the source portion and the drain portion being horizontally separated by the channel structure, each nanosheet (7) having one side (8) touching the dielectric wall (6). FIG. 12 illustrates such transistor structures called forksheet transistor structures and a cross-section therethrough. The illustrated embodiment provides more space for the active devices than if nanosheets are used. Indeed, the p-n separation takes less place if forksheet transistor structures (3a, 3b) are implemented. The reason for this is the presence of the dielectric wall (6) between the nMOS and the pMOS.

In some embodiments, the dielectric separation may be made of $SiO_2$.

FIG. 3 illustrates an example of a gate structure (9) according to an embodiment. For example, the gate may comprise a gate metal (5) such as W. Above the gate metal (5), a gate plug (19) is typically present. In an example, this gate plug (19) may utilize $Si_3N_4$. Gate spacers (3) on both sides of the gate are typically present. These spacers (3) can for instance be made of $S_3N_4$ or silicon oxicarbide.

The source and the drain electrically conductive contacts (M0A1, M0A2) can for instance be SiGe:B (p-MOS) or Si:P (n-MOS).

In an embodiment, the first electrically conductive line (MOB) may be embedded in a dielectric material (8).

In an embodiment, the first electrically conductive line (MOB) is provided as part of a set of parallel first electrically conductive lines (MOB), all arranged within a first metallization level and each extending along a same first direction.

In another embodiment, the set of first electrically conductive lines (MOB) may be arranged at a pitch of from 20 to 60 nm, from 30 to 50 nm, from 35 to 45 nm, from 37 to 41 nm, and from 38 to 40 nm. This pitch being relatively large, there is enough space between the set of first electrically conductive lines (MOB) to form a via connecting directly a line amongst the set of second electrically conductive lines (Mint1) with a gate.

The planar dielectric material may for instance be $SiO_2$.

In one or more embodiments, the opening performed during step c may be obtained by plasma etching through a hard mask.

In an embodiment, each of the first electrically conductive line (MOB), the first and second electrically conductive vias (V0A1, V0A2), the planar electrically conductive material (13), and the set of second electrically conductive lines (Mint1), may be made of a metal independently selected from metals such as Cu, Mo, Ru, or W, amongst others.

In an embodiment, the set of parallel lines (141) may be equidistant.

In an embodiment, the set of parallel lines (141) may be arranged at a pitch of from 9 to 30 nm, from 12 to 25 nm, from 14 to 22 nm, from 16 to 20 nm, and from 18 to 20 nm.

In another example embodiment, step g of etching the electrically conductive layer (Mint) and the planar electrically conductive material may be performed by any suitable method. For instance, if the electrically conductive layer (Mint) and the planar electrically conductive material (13) are both made of Ru, etching can be performed by plasma etching using $Cl_2$ and/or $O_2$ and $Cl_2$ as etchant gas in an inductively coupled plasma etching chamber.

The first electrically conductive line (MOB) can be made of either the same conductive material as a top portion of the planar electrically conductive material (13) or another conductive material as a top portion of the planar electrically conductive material (13).

If the first electrically conductive line (MOB) is made of the same conductive material as a top portion of the planar electrically conductive material (13), in some embodiments, step d may include filling the opening (11) with a planar electrically conductive material (13) comprising a bottom portion made of a different conductive material than a top portion, wherein the conductive material making the bottom portion is different from the conductive material making the first electrically conductive line (MOB) and can be etched selectively with respect to the first electrically conductive line (MOB) during step g. The thickness of the bottom portion may be smaller than the thickness of the top portion. The bottom portion serves as an etch stop layer.

If the first electrically conductive line (MOB) is made of another conductive material as a top portion of the planar electrically conductive material (13), it is preferable if step d comprises filling the opening (11) with a single planar electrically conductive material (13) which is different from the conductive material making the first electrically conductive line (MOB) and which can be etched selectively with respect to the first electrically conductive line (MOB) during step g.

In an embodiment, the set of second electrically conductive lines (Mint1) may be arranged at a pitch of from 9 to 30 nm, from 12 to 25 nm, from 14 to 22 nm, from 16 to 20 nm, and from 18 to 20 nm.

In many embodiments, the pitch of the set of parallel lines (141) is the same as the pitch of the set of second electrically conductive lines (Mint1).

In an embodiment, the set of second electrically conductive lines (Mint1) may be arranged at a pitch and the width of the interruption (17) is equal to 0.5 times the pitch.

In an embodiment, the distance separating the third electrically conductive via (Vint1) and the fourth electrically conductive via (Vint2) is 0.5 times the pitch of the set of second electrically conductive lines (Mint1).

In an embodiment, the width of each of the third and fourth vias (Vint1, Vint2) measured along the first direction from 5 to 13 nm, from 6 to 12 nm, from 7 to 11 nm, and from 8 to 10 nm. In some embodiments, the width for these two vias is 9 nm.

In an embodiment, the distance separating the third electrically conductive via (Vint1) and the fourth electrically conductive via (Vint2) may be from 5 to 13 nm, from 6 to 12 nm, from 7 to 11 nm, and from 8 to 10 nm. In some embodiments, these two vias are separated by 9 nm.

The hard mask (14) may be resistant to the etching so that by the time step i is finished, some hard mask material remains. This way, the set of second electrically conductive lines (Mint1) is not consumed during step i.

In some embodiments, the interruption (17) formed in step i may be from 5 to 13 nm, from 6 to 12 nm, from 7 to 11 nm, and from 8 to 10 nm. This interruption may have a width of 9 nm. Such a small interruption, let alone with precise alignment to the gap, has up to now been very challenging.

It is to be understood that although some embodiments, specific constructions and configurations, as well as materials, have been discussed herein for devices according to the present invention, various changes or modifications in form and detail may be made without departing from the scope of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for forming an integrated circuit or an intermediate thereof comprising the steps of:

a. providing a semiconductor structure comprising:

(1) two transistor structures separated by a dielectric separation, each transistor structure comprising a pMOS side of a first doping type and an nMOS side of a second doping type, each side forming a channel structure, a source portion, and a drain portion, the source portion and the drain portion being horizontally separated by the channel structure, (2) a gate structure on the channel structure, (3) a first electrically conductive contact and a second electrically conductive contact electrically coupled to the source portion and the drain portion of each side of each transistor structure, (4) a first electrically conductive line arranged within a first metallization level and extending along a first direction, the first electrically conductive line extending above at least part of each transistor structure, (5) a first electrically conductive via electrically connecting the first electrically conductive line with the first electrically conductive contact on a first side of a first of the two transistor structures, (6) a second electrically conductive via electrically connecting the first electrically conductive line with the second electrically conductive contact on a first side of a second of the two transistor structures, b. providing a planar dielectric material in physical contact with a top surface of the first electrically conductive line, c. forming an opening in the planar dielectric material, the opening exposing part of the first electrically conductive line, the part having a first length larger than a second length of the dielectric separation when both lengths are measured in the first direction, wherein the first length of the part comprises the second length of the dielectric separation when the second length is vertically projected on the first length of the part, d. filling the opening with a planar electrically conductive material, e. forming an electrically conductive layer arranged within a second metallization level, the electrically conductive layer being in physical contact with the planar dielectric material and in physical and electrical contact with the planar electrically conductive material, f. providing a hard mask comprising a set of parallel lines in physical contact with a top surface of the electrically conductive layer and extending along a second direction, perpendicular to the first direction, each line of the set of parallel lines having a first width measured in the first direction, each line of the set of parallel lines being directly above the planar electrically conductive material filling the opening so that the first length of the part comprises a second width between adjacent each lines of the set of parallel lines when they are vertically projected on the first length of the part, g. etching the electrically conductive layer and the planar electrically conductive material by using the hard mask lines as a mask, thereby forming:

(1) a set of second electrically conductive lines arranged within the second metallization level, and extending along the second direction, the set of second electrically conductive lines comprising a pair of neighboring lines directly above the opening, the pair of neighboring lines being separated by a first gap, (2) a third electrically conductive via extending in the opening, aligned with a first electrically conductive line of the pair, and electrically connecting the first electrically conductive line of the pair with the first electrically conductive line, and (3) a fourth electrically conductive via extending in the opening, aligned with a second electrically conductive line of the pair, and electrically connecting the second electrically conductive line of the pair with the first electrically conductive line.

2. The method of claim 1, further comprising the steps of:

h. covering with a masking material a portion of the first electrically conductive line which is not exposed by the first gap while leaving the first gap uncovered, i. interrupting the first electrically conductive line by etching it using the hard mask lines as a mask, thereby forming an interruption within the first electrically conductive line, the interruption being aligned with the first gap.

3. The method of claim 2, wherein the interruption formed is selected from the group consisting of: from 5 to 13 nm, from 6 to 12 nm, and from 7 to 11 nm.

4. The method of claim 2, wherein the interruption formed is from 8 to 10 nm.

5. The method of claim 2, wherein the hard mask is sufficiently resistant to the etching used when forming the interruption so that by the time the formation is finished, some hard mask material remains.

6. The method of claim 5, wherein the two transistor structures are two transistor nanosheet structures, wherein the pMOS side of the first doping type and the nMOS side of the second doping type are separated by a dielectric wall, each side comprising a plurality of vertically stacked nanosheets, each nanosheet having one side touching the dielectric wall.

7. The method of claim 2, wherein forming the interruption further comprises forming:

a. above the second metallization level, a set of third electrically conductive lines arranged within a third metallization level, and extending along the first direction, and b. a via electrically connecting a third electrically conductive line with a second electrically conductive line.

8. The method of claim 7, further comprising:

(1) filling the interruption, the opening, and the first gap with a dielectric material having a top surface coplanar with a top surface of the hard mask, the dielectric material being such that the hard mask can be etched selectively with respect to the dielectric material, (2) selectively removing the hard mask, thereby leaving second gaps, (3) filling the second gaps with an electrically conductive material, thereby forming the via, and (4) forming the set of third electrically conductive lines so that a third electrically conductive line is electrically connected to the second electrically conductive line by the via.

9. The method of claim 1, wherein the set of second electrically conductive lines are arranged at a pitch selected from a group consisting of: from 9 to 30 nm, from 12 to 25 nm, from 14 to 22 nm, and from 16 to 20 nm.

10. The method of claim 1, wherein the set of second electrically conductive lines are arranged at a pitch from 18 to 20 nm.

11. The method of claim 1, wherein the set of parallel lines are equidistant.

12. The method of claim 1, wherein a distance separating the third electrically conductive via and the fourth electrically conductive via is selected from a group consisting of: from 5 to 13 nm, from 6 to 12 nm, and from 7 to 11 nm.

13. The method of claim 1, wherein a distance separating the third electrically conductive via and the fourth electrically conductive via is from 8 to 10 nm.

14. The method of claim 1, wherein each of the third and fourth electrically conductive vias measured along the first direction includes a first width selected from a group consisting of: from 5 to 13 nm, from 6 to 12 nm, and from 7 to 11 nm.

15. The method of claim 1, wherein each of the third and fourth electrically conductive vias measured along the first direction includes a first width from 8 to 10 nm.

\* \* \* \* \*